(12) United States Patent
Vellianitis et al.

(10) Patent No.: US 10,164,031 B2
(45) Date of Patent: Dec. 25, 2018

(54) FINFET WITH TWO FINS ON STI

(71) Applicant: Taiwan Semiconductor Manufacturing Company, Ltd., Hsin-Chu (TW)

(72) Inventors: Georgios Vellianitis, Heverlee (BE); Mark van Dal, Linden (BE); Blandine Duriez, Brussels (BE); Richard Kenneth Oxland, Brussels (BE)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 15/357,839

(22) Filed: Nov. 21, 2016

(65) Prior Publication Data

US 2017/0069728 A1  Mar. 9, 2017

Related U.S. Application Data

(60) Continuation of application No. 14/604,401, filed on Jan. 23, 2015, now Pat. No. 9,502,541, which is a
(Continued)

(51) Int. Cl.
*H01L 29/417* (2006.01)
*H01L 21/8238* (2006.01)
(Continued)

(52) U.S. Cl.
CPC .. *H01L 29/41791* (2013.01); *H01L 21/76224* (2013.01); *H01L 21/76232* (2013.01);
(Continued)

(58) Field of Classification Search
CPC ............. H01L 29/66795; H01L 29/785; H01L 21/845; H01L 27/1211; H01L 21/823431;
(Continued)

(56) References Cited

U.S. PATENT DOCUMENTS 8,116,121 B2  2/2012 Kawasaki
8,716,156 B1  5/2014 Pawlak et al.
(Continued)

FOREIGN PATENT DOCUMENTS

CN        1913162 A    2/2007
JP     2007509490 A    4/2007
(Continued)

*Primary Examiner* — Peter Bradford
(74) *Attorney, Agent, or Firm* — Slater Matsil, LLP

(57) ABSTRACT

A fin structure for a fin field effect transistor (FinFET) device is provided. The device includes a substrate, a first semiconductor material disposed on the substrate, a shallow trench isolation (STI) region disposed over the substrate and formed on opposing sides of the first semiconductor material, and a second semiconductor material forming a first fin and a second fin disposed on the STI region, the first fin spaced apart from the second fin by a width of the first semiconductor material. The fin structure may be used to generate the FinFET device by forming a gate layer formed over the first fin, a top surface of the first semiconductor material disposed between the first and second fins, and the second fin.

20 Claims, 12 Drawing Sheets

Related U.S. Application Data division of application No. 13/431,727, filed on Mar. 27, 2012, now Pat. No. 8,987,835.

(51) Int. Cl.

| | |
|---|---|
| *H01L 27/092* | (2006.01) |
| *H01L 29/78* | (2006.01) |
| *H01L 21/762* | (2006.01) |
| *H01L 29/66* | (2006.01) |
| *H01L 27/088* | (2006.01) |
| *H01L 29/06* | (2006.01) |
| *H01L 29/36* | (2006.01) |
| *H01L 29/423* | (2006.01) |

(52) U.S. Cl.
CPC .. *H01L 21/823821* (2013.01); *H01L 27/0886* (2013.01); *H01L 27/0924* (2013.01); *H01L 29/0649* (2013.01); *H01L 29/36* (2013.01); *H01L 29/4236* (2013.01); *H01L 29/6681* (2013.01); *H01L 29/66795* (2013.01); *H01L 29/785* (2013.01)

(58) Field of Classification Search
CPC ....... H01L 21/823821; H01L 27/10879; H01L 27/0924; H01L 27/10826; H01L 29/41791; H01L 27/0886
See application file for complete search history.

(56) References Cited

U.S. PATENT DOCUMENTS

| | | | |
|---|---|---|---|
| 9,142,418 B1 | 9/2015 | Jung et al. | |
| 2005/0237850 A1 | 10/2005 | Datta et al. | |
| 2006/0138555 A1 | 6/2006 | Miyano | |
| 2006/0292772 A1 | 12/2006 | Anderson et al. | |
| 2007/0170474 A1 | 7/2007 | Kawasaki | |
| 2008/0121935 A1 | 5/2008 | Takahashi | |
| 2008/0157130 A1 | 7/2008 | Chang | |
| 2009/0026505 A1 | 1/2009 | Okano | |
| 2009/0026530 A1* | 1/2009 | Wilson | H01L 29/66795 257/328 |
| 2010/0025800 A1 | 2/2010 | Kim | |
| 2010/0029031 A1 | 2/2010 | Perruchot et al. | |
| 2010/0059821 A1 | 3/2010 | Rios et al. | |
| 2010/0129968 A1* | 5/2010 | Li | H01L 21/823821 438/154 |
| 2010/0252816 A1 | 10/2010 | Ko et al. | |
| 2011/0075713 A1 | 3/2011 | Lovberg et al. | |
| 2011/0272673 A1 | 11/2011 | Bangsaruntip et al. | |
| 2012/0286346 A1 | 11/2012 | Nakazawa | |
| 2012/0319211 A1 | 12/2012 | van Dal et al. | |
| 2013/0037869 A1 | 2/2013 | Okano | |
| 2013/0134481 A1 | 5/2013 | Bhuwalka et al. | |
| 2013/0175621 A1* | 7/2013 | Chen | H01L 29/66787 257/347 |
| 2013/0196478 A1 | 8/2013 | Chang et al. | |
| 2014/0042556 A1 | 2/2014 | Chang et al. | |
| 2014/0170998 A1 | 6/2014 | Then et al. | |
| 2015/0061014 A1 | 3/2015 | Jacob et al. | |
| 2015/0214340 A1 | 6/2015 | Maeda et al. | |

FOREIGN PATENT DOCUMENTS

| | | |
|---|---|---|
| KR | 20100029738 A | 3/2010 |
| KR | 1020100111241 A | 10/2010 |
| WO | 2005122272 A1 | 12/2005 |

\* cited by examiner

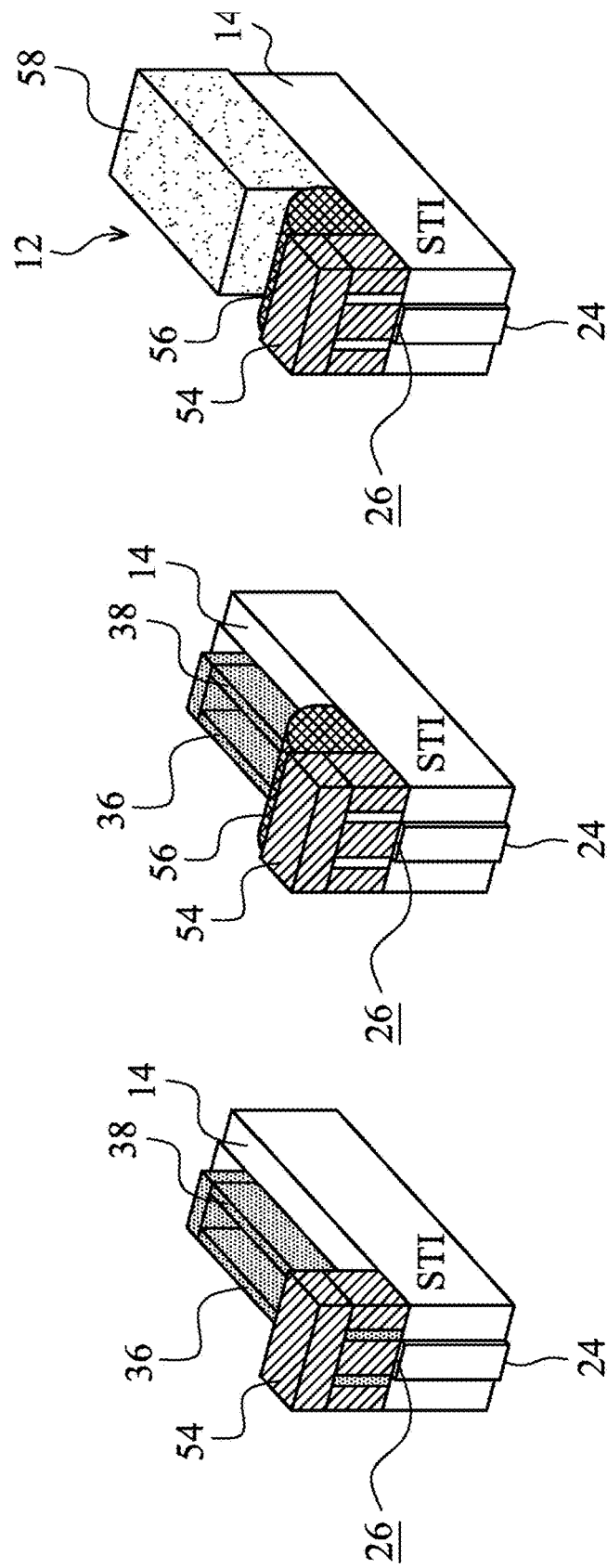

FINFET WITH TWO FINS ON STI

This application is continuation application of and claims the benefit of U.S. application Ser. No. 14/604,401, filed Jan. 23, 2015, entitled Forming Fins on the Sidewalls of a Sacrificial Fin to Form a FinFET," which is a divisional application of and claims the benefit of U.S. application Ser. No. 13/431,727, now U.S. Pat. No. 8,987,835, filed Mar. 27, 2012, entitled, "Fin Structure for a FinFET Device," which application is hereby incorporated herein by reference.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors will be used in advanced transistor nodes. For example, FinFETs not only improve areal density but also improve gate control of the channel.

In an effort to increase the performance and reduce the power consumption of complementary metal-oxide-semiconductor (CMOS) and MOSFET devices, the semiconductor industry has employed high mobility semiconductors to replace silicon as the transistor channel. The semiconductor industry has also encouraged substrate isolation techniques through, for example, silicon on insulator (SOI) and heterostructure devices, which can improve off-state characteristics.

BRIEF DESCRIPTION OF THE DRAWINGS

For a more complete understanding of the present disclosure, and the advantages thereof, reference is now made to the following descriptions taken in conjunction with the accompanying drawing, in which:

FIGS. 5a-5g is a collectively illustrate an embodiment of a process of forming a FinFET device using one of the processes collectively illustrated in FIG. 1a-1h, 3a-3i, or 4a-4f.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to preferred embodiments in a specific context, namely a FinFET metal oxide semiconductor (MOS). The invention may also be applied, however, to other integrated circuits, electronic structures, and the like.

Figure 1C:
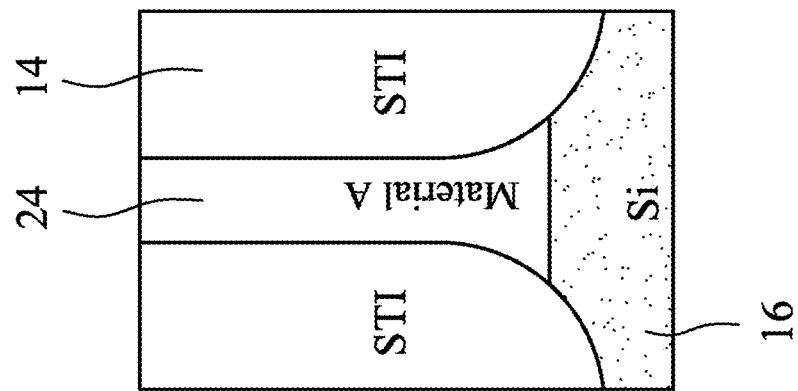
FIGS. 1a-1h collectively illustrate an embodiment of a process of forming a fin structure for a FinFET device.
Figure 1B:
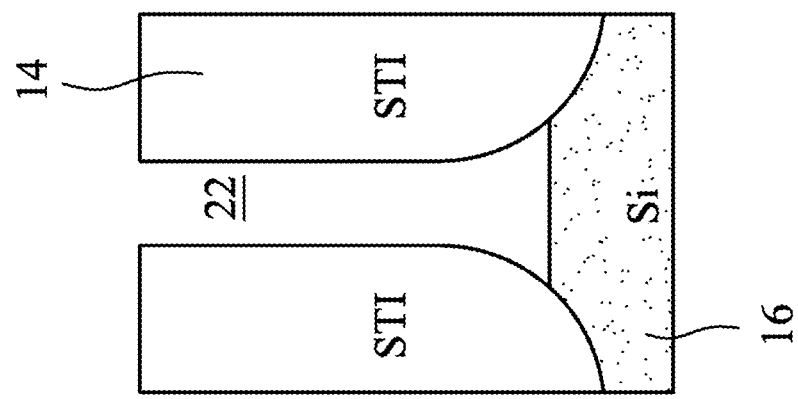
Figure 1A:
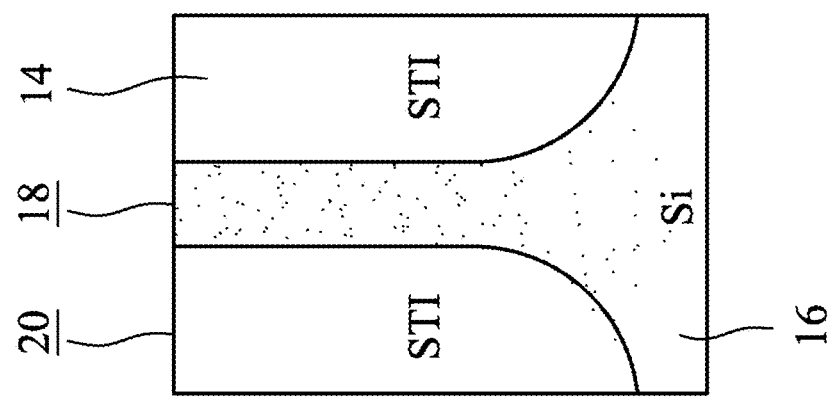
Figure 1D:
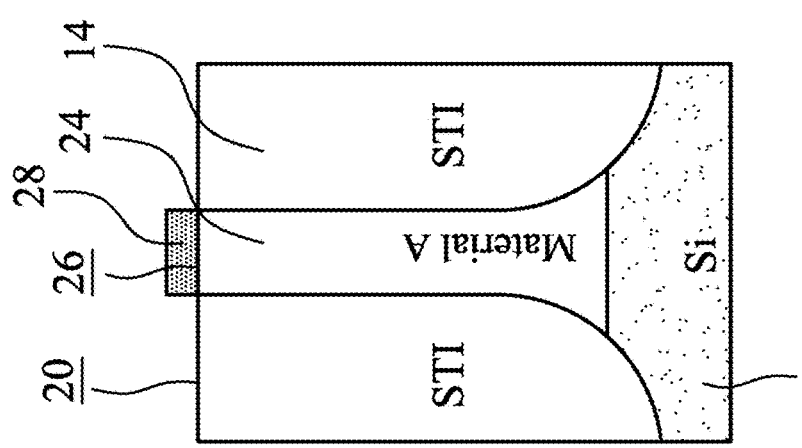
Figure 1E:
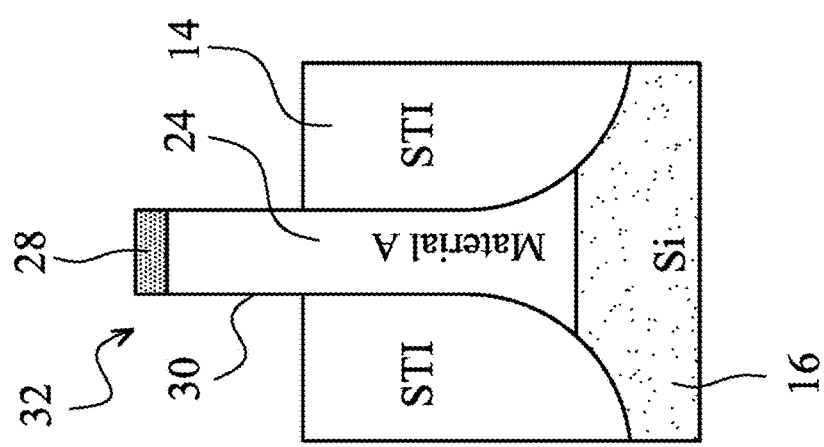
Figure 1F:
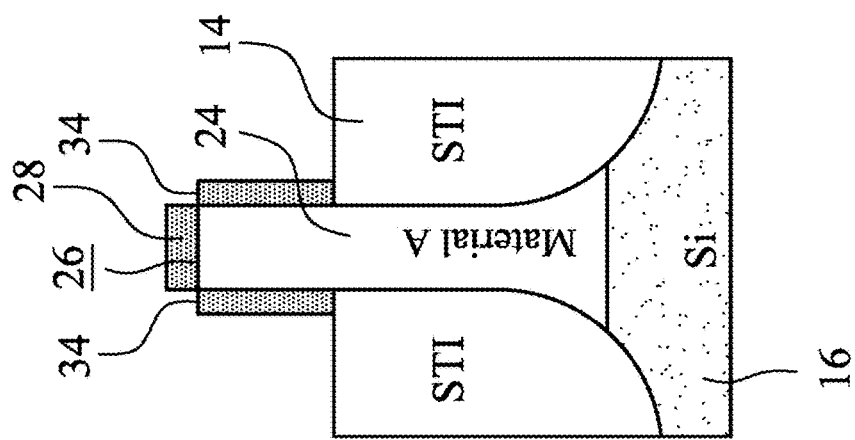
Figure 1H:
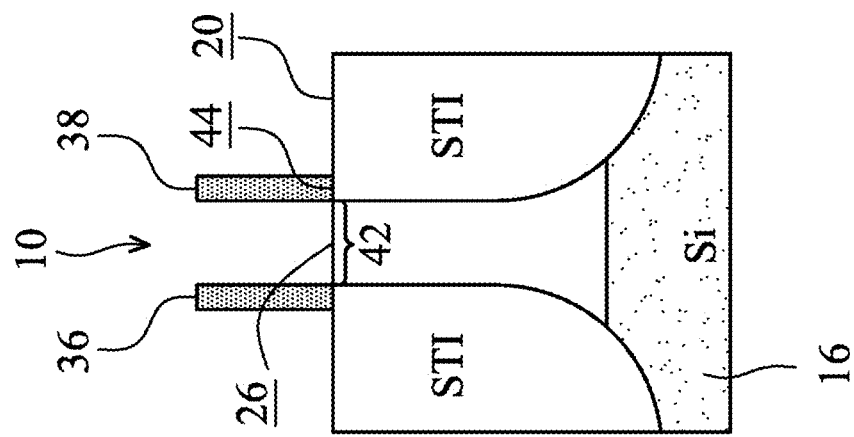
Figure 1G:
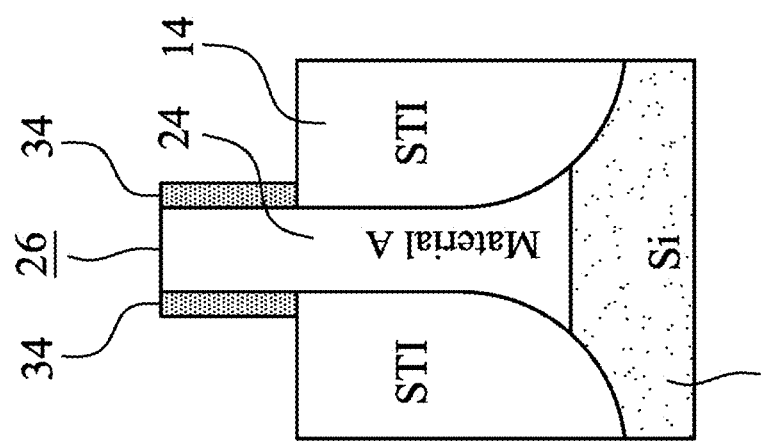
Figure 2:
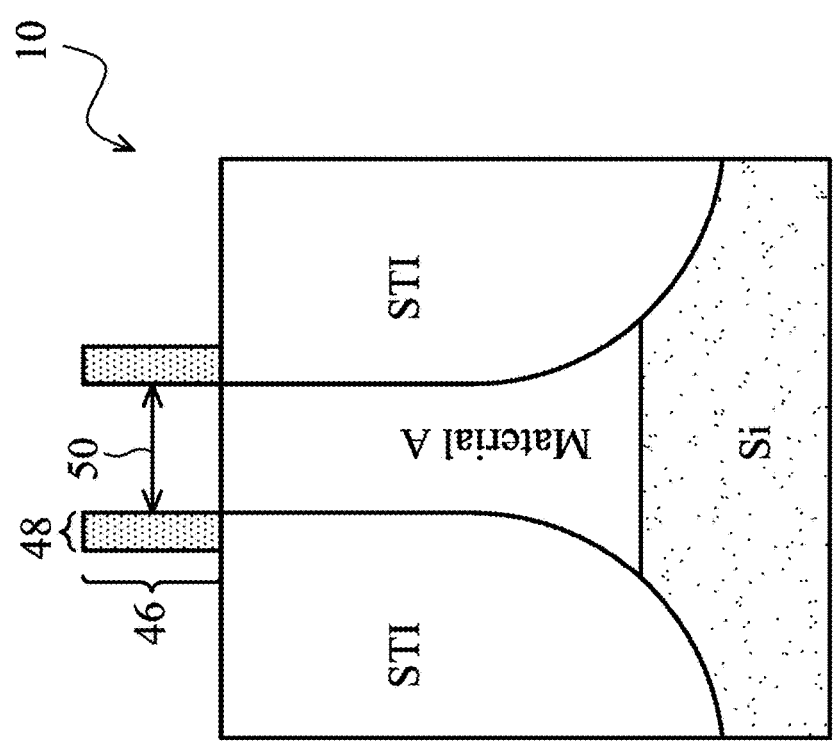
FIG. 2 is a cross section of an embodiment of the fin structure produced using the process of FIG. 1.

FIGS. 1a-1h collectively illustrate an embodiment of a process of forming a fin structure 10, which is depicted in FIG. 2, for a FinFET device 12, which is depicted in FIG. 5g. As will be more fully explained below, the fin structure 10 produces a FinFET device 12 with enhanced transistor performance and improved power consumption by doubling fin density and improving substrate isolation. Indeed, the FinFET device 12 implementing the fin structure 10 provides superior performance, a short channel effect, and desirable off-state leakage control. In addition, the FinFET device 12 formed using the fin structure 10 disclosed herein increases the gate controlled area and decreases the width of the gate in the FinFET device 12 without having to increase the device footprint.

Referring now to FIG. 1a, a shallow trench isolation (STI) region 14 is formed around a substrate 16. In an embodiment, the STI region 14 is formed from silicon dioxide or other suitable dielectric material. In an embodiment, the substrate 16 is silicon or other suitable semiconductor material. As shown, the substrate 16 generally projects upwardly between portions of the STI region 14. In addition, a top surface 18 of the substrate 16 and a top surface 20 of the STI regions 14 are generally co-planar.

Referring now to FIG. 1b, a recess 22 is formed by etching away an upper portion of the substrate 16. Thereafter, in FIG. 1c, a first semiconductor material 24 (a.k.a., Material A) is formed in the recess 22. In an embodiment, the first semiconductor material 24 is epitaxially grown in the recess 22. In an embodiment, after the recess 22 is filled with the first semiconductor material 24 a chemical mechanical planarization (CMP) process is performed to smooth a top surface 26 of the first semiconductor material 24 and the top surface 20 of the adjacent STI regions 14.

In an embodiment, the first semiconductor material 24 is germanium (Ge), indium phosphide (InP), indium gallium arsenide (InGaAs), indium arsenide (InAs), gallium antimonide (GaSb), or silicon germanium (SiGe). In an embodiment, the first semiconductor material 24 is a group IV, a group III-V, or a group II-VI semiconductor material. In an embodiment, the first semiconductor material 24 is an alloy of SiGe having the formula $Si_{1-x}Ge_x$ (with 1>x>0).

Referring to FIG. 1d, a hard mask 28 is formed upon the first semiconductor material 24. In an embodiment, the hard mask 28 is formed from silicon nitride or other suitable mask material. Once the hard mask 28 has been deposited, a photolithography process is performed to pattern the hard mask as shown in FIG. 1d. Next, the upper portion of the STI region 14 is etched selectively to the hard mask as shown in FIG. 1e. As depicted in FIG. 1e, opposing sidewalls 30 from an upper portion 32 of the first semiconductor material 24 are now exposed.

Referring now to FIG. 1f, a second semiconductor material 34 (a.k.a., Material B) is formed on and over the sidewalls 30 of the first semiconductor material 24. In an embodiment, the second semiconductor material 34 is epitaxially grown along the sidewalls 30 of the first semiconductor material 24. As shown, the second semiconductor material 34 is seated upon and projects above the STI region 14. Because the hard mask 28 has not been removed, the second semiconductor material 34 is not grown or otherwise formed upon the top surface 26 of the first semiconductor material 24.

With the second semiconductor material 34 disposed on the sidewalls 30 of the first semiconductor material 24, the hard mask 28 may be removed as illustrated in FIG. 1g. In an embodiment, the hard mask 28 is removed without attacking the adjacent second semiconductor material 34 and STI regions 14. Thereafter, a selective etch process is performed to remove the upper portion 32 (FIG. 1e) of the first semiconductor material 24 as shown in FIG. 1h. As shown in FIG. 1h, after the first semiconductor material 24 has been etched away, the second semiconductor material 24 forms a first fin 36 and a second fin 38 of the overall fin structure 10.

The first and second fins 36, 38 are generally disposed upon and directly contact the STI region 14 and have a recess 40 interposed between them. In addition, in an embodiment the first fin 36 is spaced apart from the second fin 38 by a width 42 of the first semiconductor material 24. Still referring to FIG. 1h, the top surface 26 of the first semiconductor material 24 and/or the top surface 20 of the STI region 14 is generally co-planar with a bottom surface 44 of the first and second fins 36, 38. In an embodiment, the top surface 26 of the first semiconductor material 24 may be disposed vertically below the top surface 20 of the STI region 14. As shown, the first and second fins 36, 38 project vertically above the top surface of the first semiconductor material 24. In an embodiment, the first semiconductor material 24 is doped to inhibit or prevent conduction through the first semiconductor material 24.

In an embodiment, the second semiconductor material 34 is silicon (Si) when the first semiconductor material 24 is germanium (Ge). In such an embodiment, the germanium may be etched away with very high selectivity using a solution of hydrochloric acid (HCl). In an embodiment, the second semiconductor material 34 is indium gallium arsenide (InGaAs) when the first semiconductor material 24 is indium phosphide (InP). In such an embodiment, the indium phosphide may be etched away with very high selectivity using a solution of hydrochloric acid (HCl).

In an embodiment, the second semiconductor material 34 is indium phosphide (InP) when the first semiconductor material 24 is indium gallium arsenide (InGaAs). In such an embodiment, the indium gallium arsenide may be etched away with very high selectivity using a solution of phosphoric acid and hydrogen peroxide ($H_3PO_4+H_2O_2$). In an embodiment, the second semiconductor material 34 is gallium antimonide (GaSb) when the first semiconductor material 24 indium arsenide (InAs). In such an embodiment, the indium arsenide may be etched away with very high selectivity using a solution of citric acid and hydrogen peroxide ($C_6H_8O_7+H_2O_2$).

In an embodiment, the second semiconductor material 34 is indium arsenide (InAs) when the first semiconductor material 24 gallium antimonide (GaSb). In such an embodiment, the gallium antimonide may be etched away with very high selectivity using a solution of ammonium hydroxide ($NH_4OH$). Other combinations and other etch compounds are possible in other embodiments. In some embodiments, selectivity may approach or achieve one hundred percent.

In an embodiment, the second semiconductor material 34 is a group IV, a group III-V, or a group II-VI semiconductor material. In an embodiment, the second semiconductor material 34 is an alloy of SiGe having the formula $Si_{1-y}Ge_y$ (with 1>y>0) when the first semiconductor material 24 is an alloy of SiGe having the formula $Si_{1-x}Ge_x$ (with 1>x>0), in which case x>y. In such an embodiment, the alloy of SiGe having the formula $Si_{1-x}Ge_x$ may be etched away with very high selectivity using a solution of hydrochloric acid (HCl).

Referring now to FIG. 2, in an embodiment a height 46 of the first and second fins 36, 38 on the fin structure 10 may be between about five nanometers (5 nm) and about forty nanometers (40 nm). In an embodiment, a width 48 of the first and second fins 36, 38 may be between about two nanometers (2 nm) and about ten nanometers (10 nm). In an embodiment, a distance 50 between the first and second fins 36, 38 (which generally equates to the width of the upper portion 42 of first semiconductor material 24, as shown in FIG. 1h) may be between about five nanometers (5 nm) and about twenty nanometers (20 nm). Other dimensions may be possible in other embodiments.

Figure 3C:
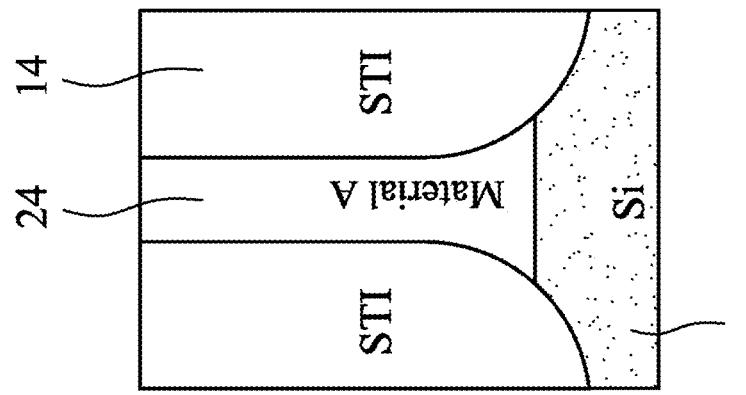
FIGS. 3a-3i collectively illustrate an embodiment of a process of forming the fin structure of FIG. 2.
Figure 3B:
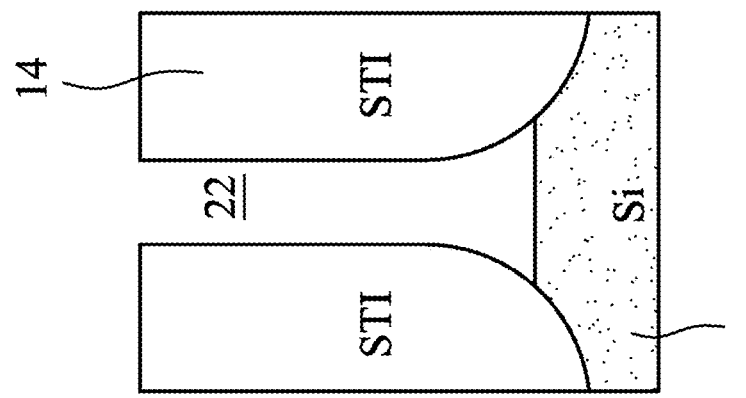
Figure 3A:
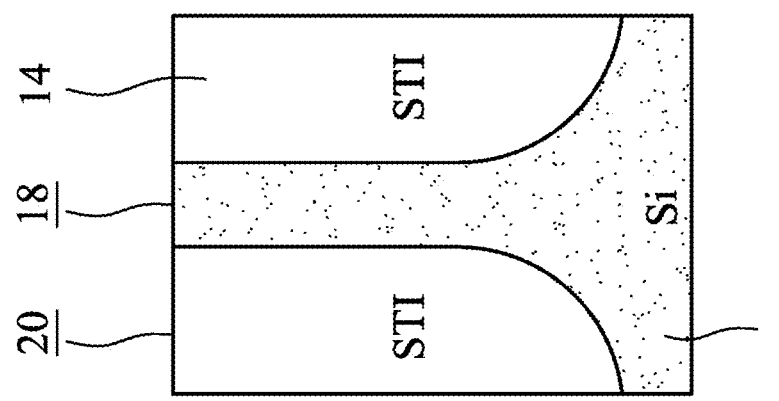
Figure 3F:
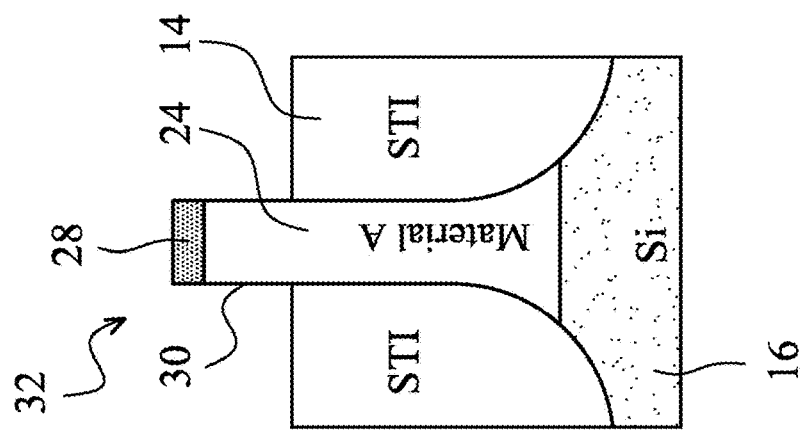
Figure 3E:
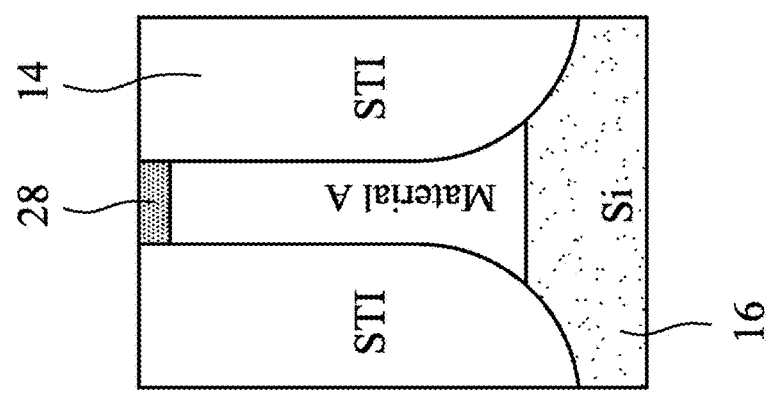
Figure 3D:
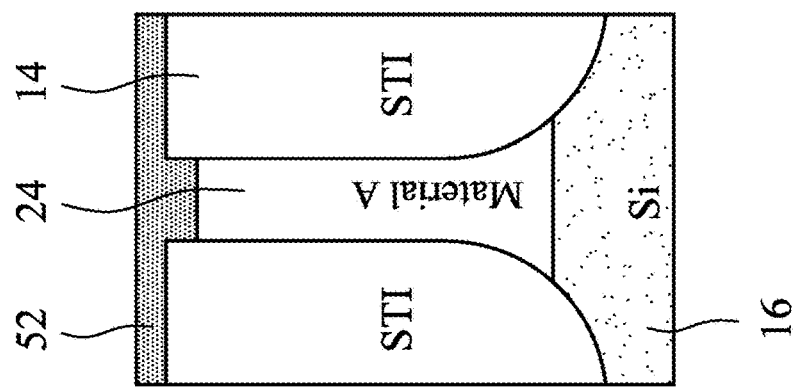
Figure 3I:
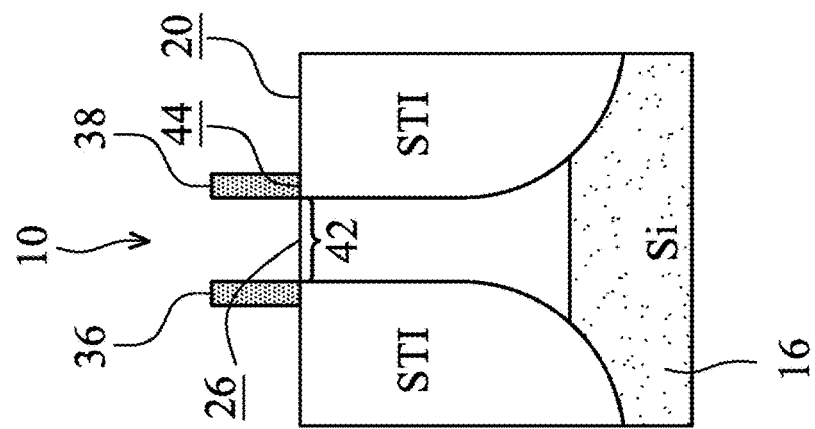
Figure 3H:
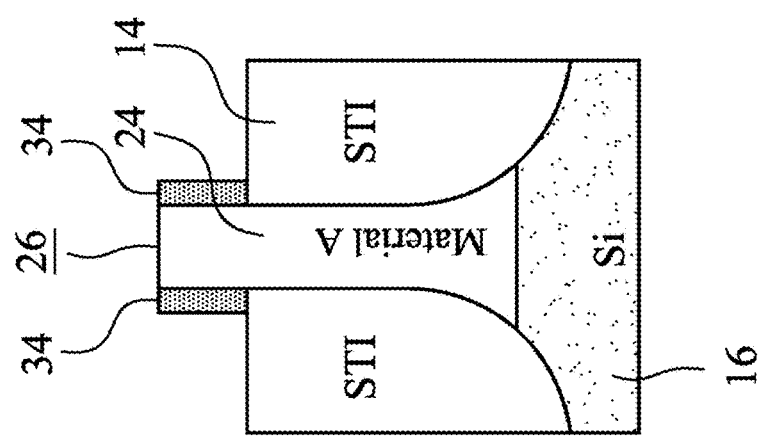
Figure 3G:
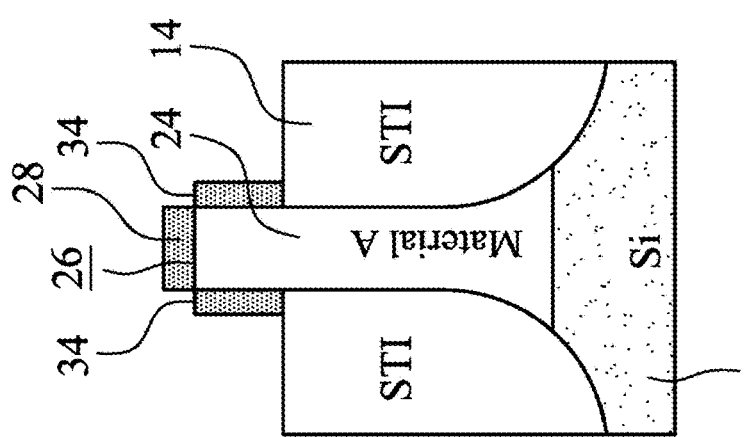

FIGS. 3a-1i collectively illustrate another embodiment of a process of forming a fin structure for a FinFET device. After performing the steps of FIGS. 3a-3c as previously described above, the first semiconductor material 24 is recessed and a hard mask layer 52 is formed as depicted in FIG. 3d. Thereafter, as shown in FIG. 3e a CMP process is performed to generate the hard mask 28, which is embedded within the STI region 14. Thereafter, the steps of FIGS. 3f-3i are performed as previously described above.

Figure 4C:
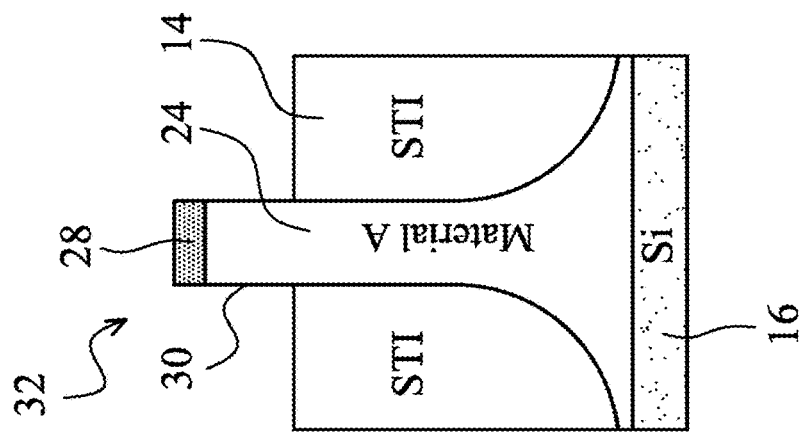
FIGS. 4a-4f collectively illustrate an embodiment of a process of forming the fin structure of FIG. 2.
Figure 4B:
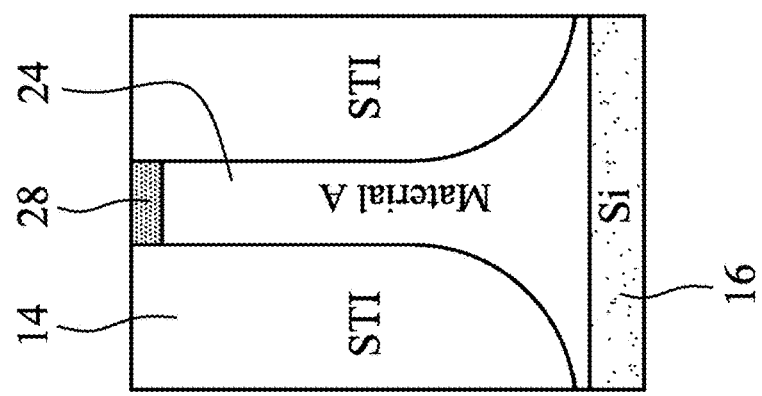
Figure 4A:
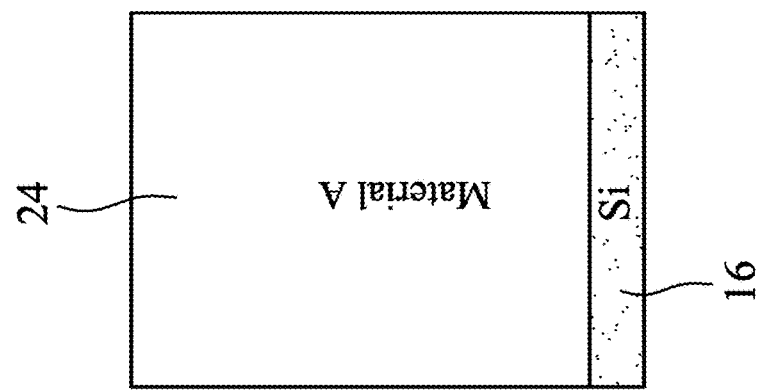
Figure 4D:
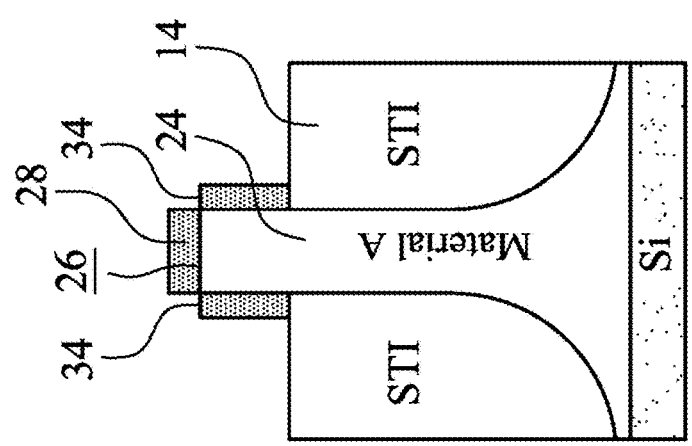
Figure 4E:
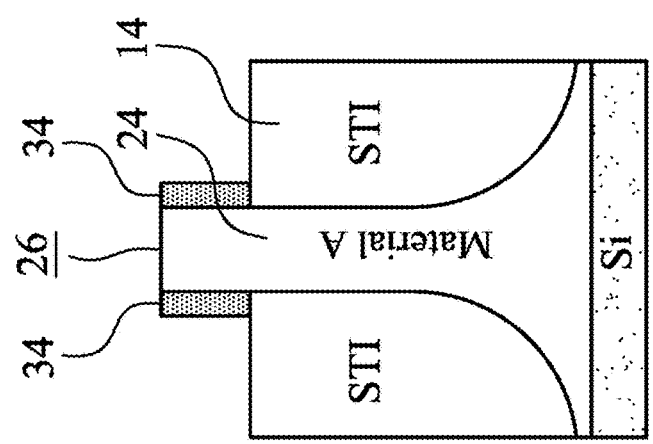
Figure 4F:
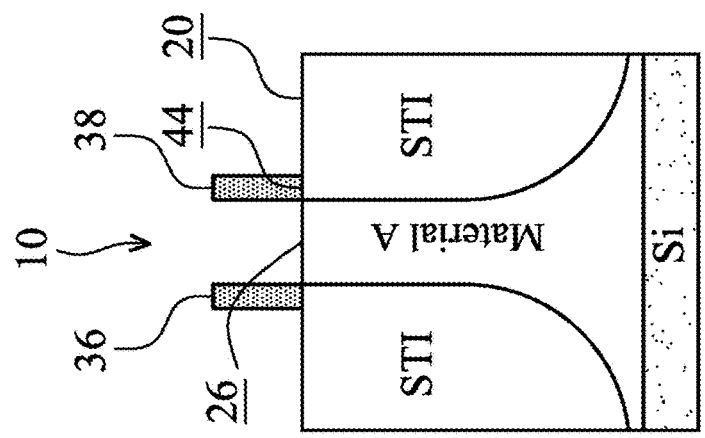

FIGS. 4a-4f collectively illustrate another embodiment of a process of forming a fin structure for a FinFET device. As shown in FIG. 4a, a blanket layer of the first semiconductor material 24 is grown or deposited upon the substrate 16. Thereafter, a portion of the first semiconductor material 24 is etched away and replaced by STI region 14 as shown in FIG. 4b. In FIG. 4b the first semiconductor material 24 is also etched to provide room for formation of the hard mask 28 thereon. Thereafter, the steps of FIGS. 4c-4f are performed as previously described above.

Figure 5D:
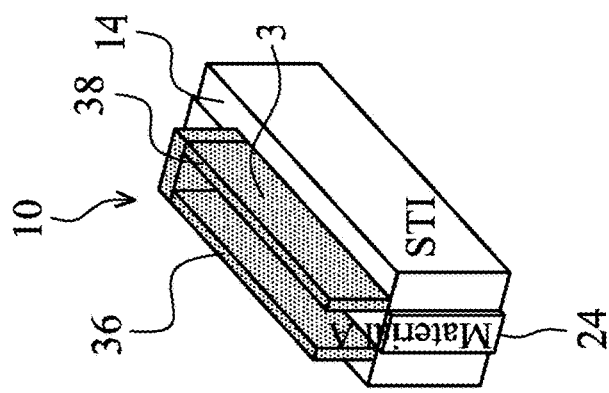
Figure 5C:
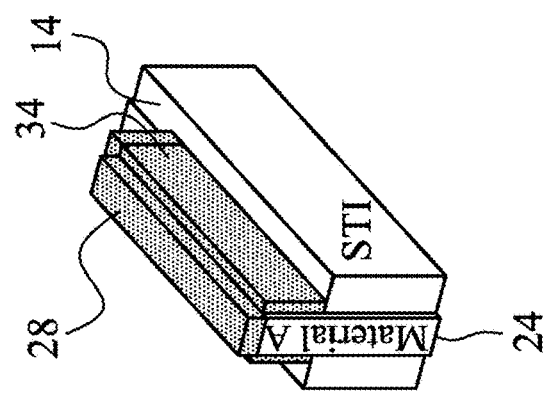
Figure 5B:
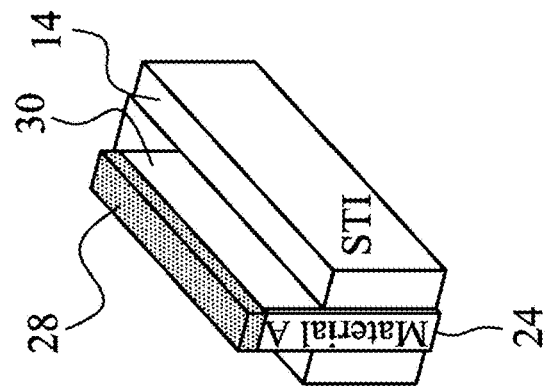
Figure 5A:
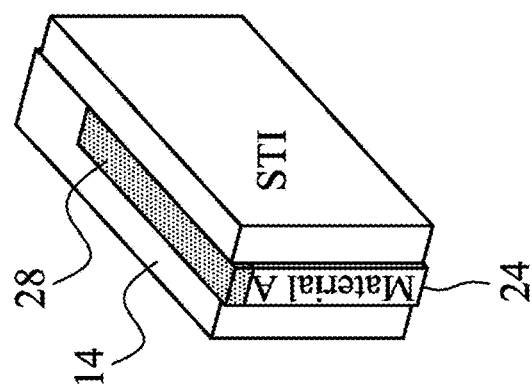

FIGS. 5a-5g collectively illustrate an embodiment of a process of forming the FinFET device 12 using, for example, one of the processes collectively illustrated in FIG. 1a-1h, 3a-3i, or 4a-4f to generate the fin structure 10. As shown in FIG. 5a, the hard mask 28 has been formed upon the first semiconductor material 24, which is surrounded by the STI region 14. Thereafter, in FIG. 5b an upper portion of the STI region 14 is removed to expose the sidewalls 30 of the first semiconductor material 24. Notably, the hard mask 28 is still present. Next, as shown in FIG. 5c the second semiconductor material 34 is epitaxially grown on and over the sidewalls 30 and above the STI region 14.

Once the second semiconductor material 34 has been formed, the hard mask 28 and then the upper portion of the first semiconductor material 24 (i.e., the portion of the first semiconductor material 24 disposed above the STI region 14) are removed, which leaves the fin structure 10. As noted above, the first semiconductor material 24 is selectively removed relative to the second semiconductor material 34. As shown in FIG. 5d, the removal of the upper portion of the first semiconductor material 24 leaves first and second fins 36, 38, which are spaced apart from each other a distance equal to the width of the first semiconductor material 24. The fins 36, 38 are formed from the second semiconductor material 34.

As shown in FIG. 5e, a gate layer 54 is formed over a portion of the STI region 14, the first fin 36, the top surface 26 of the first semiconductor material 24, the second fin 38, and then an additional portion of the STI region 14. As shown in FIGS. 5f-5g, a spacer 56 and a source/drain contact 58 is formed. For ease of illustration, only one of the spacers 56 and one of the source/drain contacts 58 has been shown in FIG. 5g. However, those skilled in the art will appreciate that additional spacers 56 and additional source/drain contacts 58 may be formed and employed by the FinFET device 12. In an embodiment, the source/drain contact 58 is formed through an epitaxial growth process.

Figure 6:
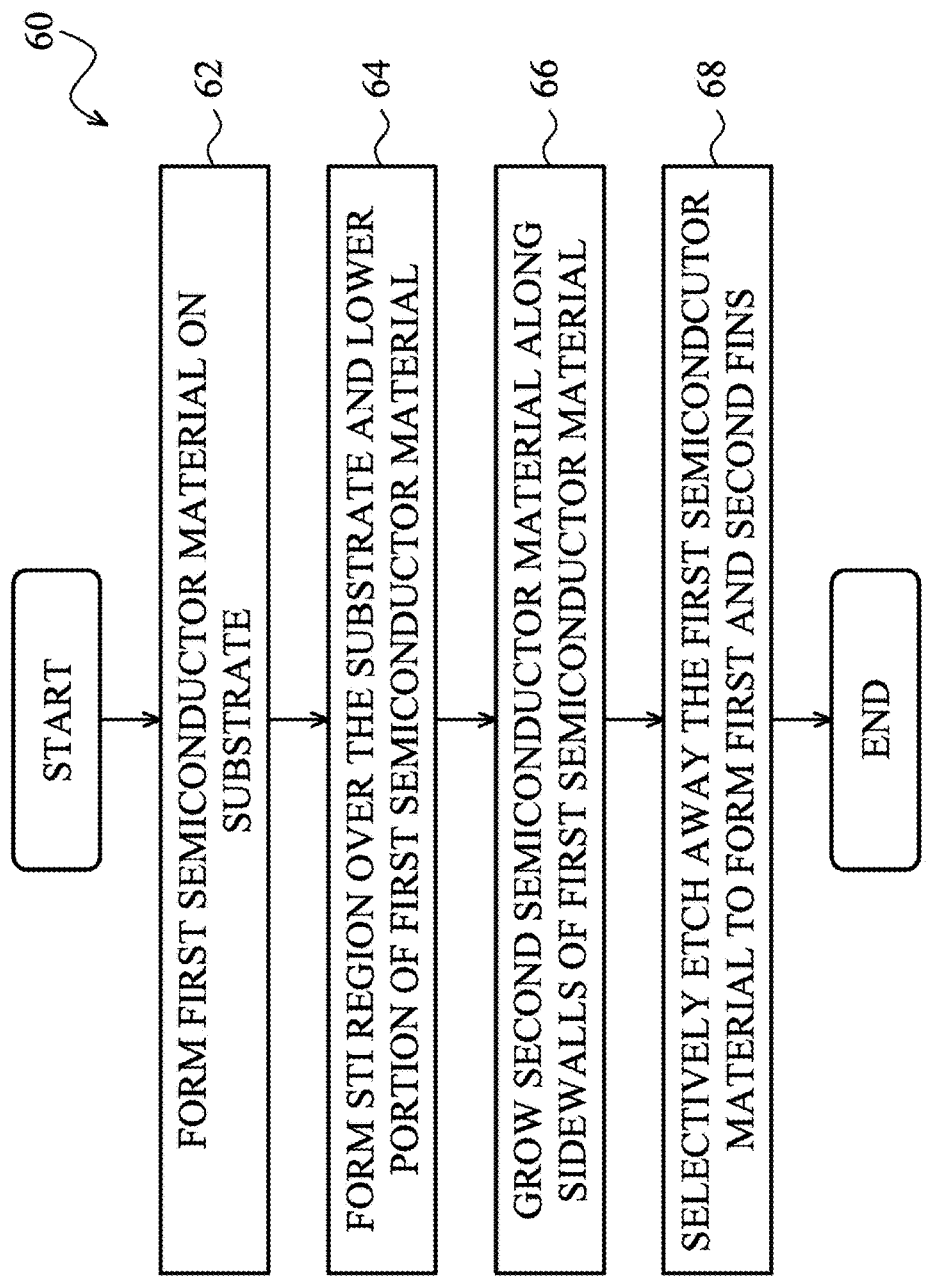
FIG. 6 is an embodiment of a method of forming the fin structure of FIG. 2.

Referring now to FIG. 6, a method 60 of forming a FinFET device is provided. In block 62, the first semiconductor material 24 is formed on the substrate. In block 64, the STI region 14 is formed over the substrate 16 and a lower portion of the first semiconductor material 24. In block 66, a second semiconductor material is epitaxially grown along sidewalls 30 of the upper portion 32 of the first semiconductor material 24. In block 68, the upper portion of the first semiconductor material is selectively etched away to form the first fin 36 and the second fin 38, which are spaced apart from each other by a width of the first semiconductor material 24.

A fin structure for a fin field effect transistor (FinFET) device. The device comprises a substrate, a first semiconductor material disposed on the substrate, a shallow trench isolation (STI) region disposed over the substrate and formed on opposing sides of the first semiconductor material, and a second semiconductor material forming a first fin and a second fin disposed on the STI region, the first fin spaced apart from the second fin by a width of the first semiconductor material.

A field effect transistor (FinFET) device. The device comprises a substrate, a first semiconductor material disposed on the substrate, a shallow trench isolation (STI) region disposed over the substrate and formed on opposing sides of the first semiconductor material, a second semiconductor material forming a first fin and a second fin disposed on the STI region, the first fin spaced apart from the second fin by a width of the first semiconductor material, and a gate layer formed over the first fin, a top surface of the first semiconductor material disposed between the first and second fins, and the second fin.

A method of forming a fin field effect transistor (FinFET) device. The method comprises forming a first semiconductor material on a substrate, forming a shallow trench isolation (STI) region over the substrate and a lower portion of the first semiconductor material, epitaxially growing a second semiconductor material along sidewalls of an upper portion of the first semiconductor material, and selectively etching away the upper portion of the first semiconductor material to form a first fin and a second fin, the first fin spaced apart from the second fin by a width of the first semiconductor material.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A fin field effect transistor (FinFET) device comprising:
 a shallow trench isolation (STI) region on opposing sides of a base fin;
 a first fin and a second fin disposed on the STI region, the first fin spaced apart from the second fin by a width of the base fin, wherein the base fin is formed of a first semiconductor material, wherein the first fin and the second fin are formed of a second semiconductor material, wherein the first semiconductor material is a different semiconductor material than the second semiconductor material; and
 a gate structure interposed between the first fin and the second fin.

2. The FinFET of claim 1, wherein lower surfaces of the first fin and the second fin are above an upper surface of the base fin.

3. The FinFET of claim 1, wherein the base fin is formed of a first alloy of silicon germanium, the first fin and the second fin are formed of a second alloy of silicon germanium, the first alloy being different than the second alloy.

4. The FinFET of claim 3, wherein the second alloy has a lower concentration of germanium than the first alloy.

5. The FinFET of claim 1, wherein an upper surface of the base fin is disposed below an upper surface of the STI region.

6. The FinFET of claim 1, further comprising a source/drain region adjacent the gate structure, the source/drain region comprising a semiconductor material extending between the first fin and the second fin.

7. The FinFET of claim 1, wherein a sidewall of the first fin is horizontally aligned with a first sidewall of the base fin, and a sidewall of the second fin is horizontally aligned with a second sidewall of the base fin.

8. The FinFET of claim 1, wherein the base fin comprises dopants of an opposite conductivity than the first fin and the second fin.

9. A fin field effect transistor (FinFET) comprising:
 a first fin over an isolation region, the first fin comprising a semiconductor material;
 a second fin over the isolation region, the second fin comprising the semiconductor material;
 a third fin interposed between the first fin and the second fin in a plan view, wherein the semiconductor material of the first fin is different than a semiconductor material of the third fin, an upper surface of the third fin being level with an upper surface of the isolation region, wherein a sidewall of the first fin is laterally aligned with a first sidewall of the third fin, and wherein a sidewall of the second fin is laterally aligned with a second sidewall of the third fin, the first sidewall and the second sidewall being opposing sidewalls of the third fin; and
 a gate structure along opposing sides of the first fin, the gate structure extending over a portion of the third fin.

10. The FinFET of claim 9, further comprising a spacer adjacent the gate structure.

11. The FinFET of claim 10, further comprising an epitaxial source/drain region adjacent the spacer, the spacer being interposed between the epitaxial source/drain region and the gate structure.

12. The FinFET of claim 9, wherein the third fin is doped.

13. The FinFET of claim 12, wherein the gate structure does not extend along sidewalls of the third fin.

14. The FinFET of claim 9, wherein the gate structure extends along opposing sides of the second fin.

15. A fin field effect transistor (FinFET) comprising:
 a first fin having an isolation region on opposing sides of the first fin, the first fin having a first side and a second side opposite the first side;
 a second fin on the isolation region directly adjacent the first side of the first fin, the second fin being on a first side of the first fin in a plan view;
 a third fin on the isolation region directly adjacent the second side of the first fin, the third fin being on a second side of the first fin in a plan view, wherein the second fin and the third fin comprise of a different semiconductor material than the first fin; and a gate structure on opposing sides of the second fin, sidewalls of the first fin being free of the gate structure.

16. The FinFET of claim 15, wherein a bottom surface of the second fin and the third fin are above a topmost surface of the first fin.

17. The FinFET of claim 15, wherein the third fin is formed of silicon.

18. The FinFET of claim 15, wherein the first fin and the second fin are formed of silicon germanium.

19. The FinFET of claim 15, further comprising a source/drain semiconductor material extending between the second fin and the third fin.

20. The FinFET of claim 15, wherein the first fin is doped.

* * * * *